(12) United States Patent
Chou

(10) Patent No.: US 8,897,000 B2
(45) Date of Patent: Nov. 25, 2014

(54) SERVER

(75) Inventor: Chih-Wei Chou, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 301 days.

(21) Appl. No.: 13/228,456

(22) Filed: Sep. 9, 2011

(65) Prior Publication Data

US 2012/0063080 A1    Mar. 15, 2012

Related U.S. Application Data

(60) Provisional application No. 61/381,424, filed on Sep. 9, 2010.

(51) Int. Cl.
*G06F 1/16* (2006.01)
*H05K 5/00* (2006.01)
*H05K 7/14* (2006.01)
*G06F 1/18* (2006.01)

(52) U.S. Cl.
CPC .............. *H05K 7/1487* (2013.01); *G06F 1/183* (2013.01)
USPC ................. 361/679.32; 361/679.31; 361/752; 361/790; 361/797

(58) Field of Classification Search
USPC ............. 361/679.01–679.45, 679.55–679.59, 361/724–727, 756, 752, 732, 790, 797
See application file for complete search history.

(56) References Cited

U.S. PATENT DOCUMENTS

| | | | |
|---|---|---|---|
| 6,055,152 A * | 4/2000 | Felcman et al. | 361/679.39 |
| 6,118,668 A * | 9/2000 | Scholder et al. | 361/753 |
| 6,411,506 B1 * | 6/2002 | Hipp et al. | 361/679.41 |
| 6,542,997 B1 * | 4/2003 | Rolls et al. | 713/324 |
| 6,894,895 B2 * | 5/2005 | Willis et al. | 361/679.32 |
| 7,312,999 B1 * | 12/2007 | Miyamura et al. | 361/724 |
| 7,499,285 B2 * | 3/2009 | Chen et al. | 361/752 |
| 7,639,507 B2 * | 12/2009 | Chen et al. | 361/756 |
| 8,134,843 B2 * | 3/2012 | Wu et al. | 361/796 |
| 2008/0259579 A1 | 10/2008 | Chen et al. | |
| 2009/0073645 A1 | 3/2009 | Tsai et al. | |

FOREIGN PATENT DOCUMENTS

| | | |
|---|---|---|
| TW | M372609 | 1/2010 |
| TW | I323400 | 4/2010 |

* cited by examiner

*Primary Examiner* — Nidhi Desai
(74) *Attorney, Agent, or Firm* — Jianq Chyun IP Office

(57) ABSTRACT

A server includes a casing, a motherboard, a power supply unit and a pair of expansion modules. The motherboard is disposed in the casing, and the motherboard includes two slots disposed in the casing. The power supply unit is disposed in the casing and under the motherboard. The expansion modules are disposed in the casing, and each of the expansion modules includes a connecting card and a plurality of expansion cards. When the connecting card is electrically coupled to one of the slots of the motherboard, the expansion modules are disposed at two opposite sides of the motherboard correspondingly.

8 Claims, 6 Drawing Sheets

SERVER

CROSS-REFERENCE TO RELATED APPLICATION

This application claims the priority benefits of U.S. provisional application Ser. No. 61/381,424, filed on Sep. 9, 2010. The entirety of the above-mentioned patent applications is hereby incorporated by reference herein and made a part of this specification.

BACKGROUND OF THE INVENTION

1. Field of the Invention

The invention relates to a server.

2. Description of the Related Art

A server mainly can be divided to three types according to its appearance, such as a pedestal server, a rack server and a blade server. The rack server occupies less space. The size of the rack server meets a standard. The width of the rack server is usually 19 inches, and the height is measured in unit (U) (1U equals to 1.75 inches). The 1U server is taken as an example. Although the 1U server is lighter, thinner and with full functions, it is difficult to expand components and update due to the height limitation according to the standard. As a result, the size of the rack server is enlarged (such as a 2U, 4U server) for accommodating more components.

BRIEF SUMMARY OF THE INVENTION

A server, which can accommodate more expansion cards in limited space and have more efficient space utilization, is disclosed.

The server includes a casing, a motherboard, a power supply unit and expansion modules. The motherboard includes two slots disposed in the casing. The power supply unit is disposed in the casing. The expansion modules are disposed in the casing, each of the expansion modules includes a plurality of expansion cards and a connecting card electrically coupled to one of the slots of the motherboard, and in one embodiment, the expansion modules are disposed at two opposite sides of the motherboard correspondingly.

These and other features, aspects and advantages of the present invention will become better understood with regard to the following description, appended claims, and accompanying drawings.

DETAILED DESCRIPTION OF THE EMBODIMENTS

Figure 1:
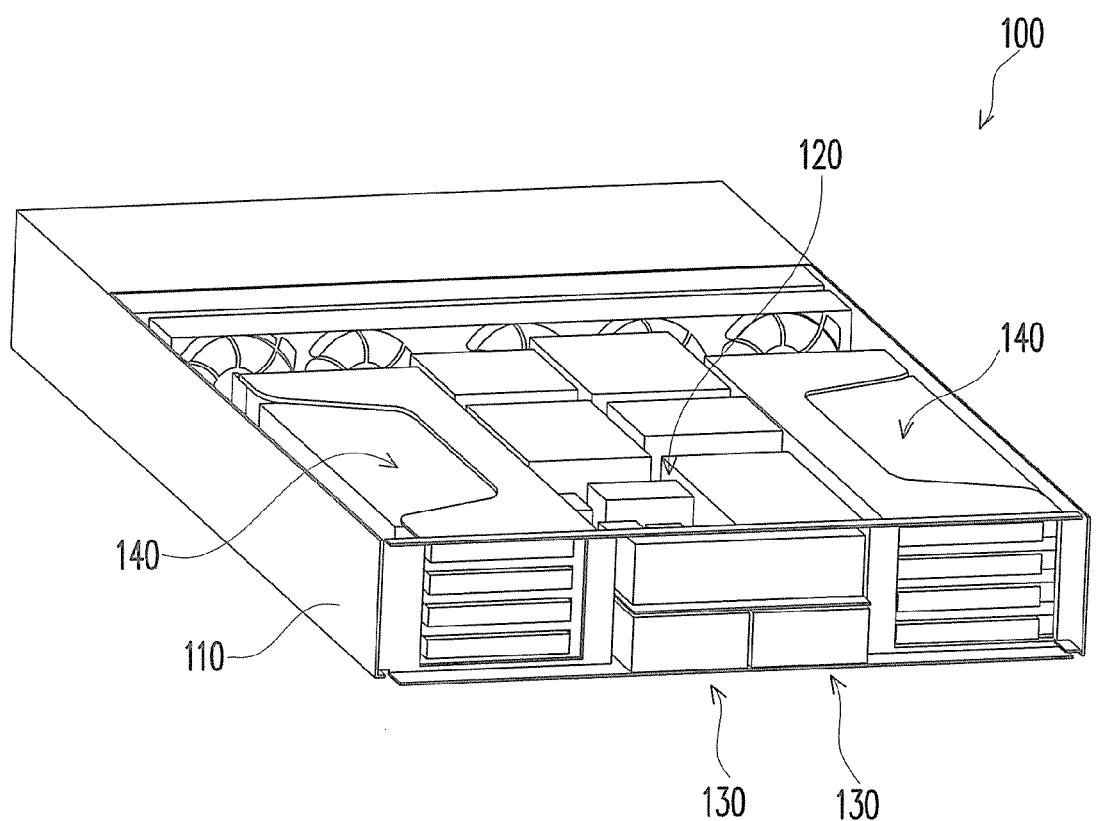
FIG. 1 is a schematic diagram showing a server in an embodiment.
Figure 2:
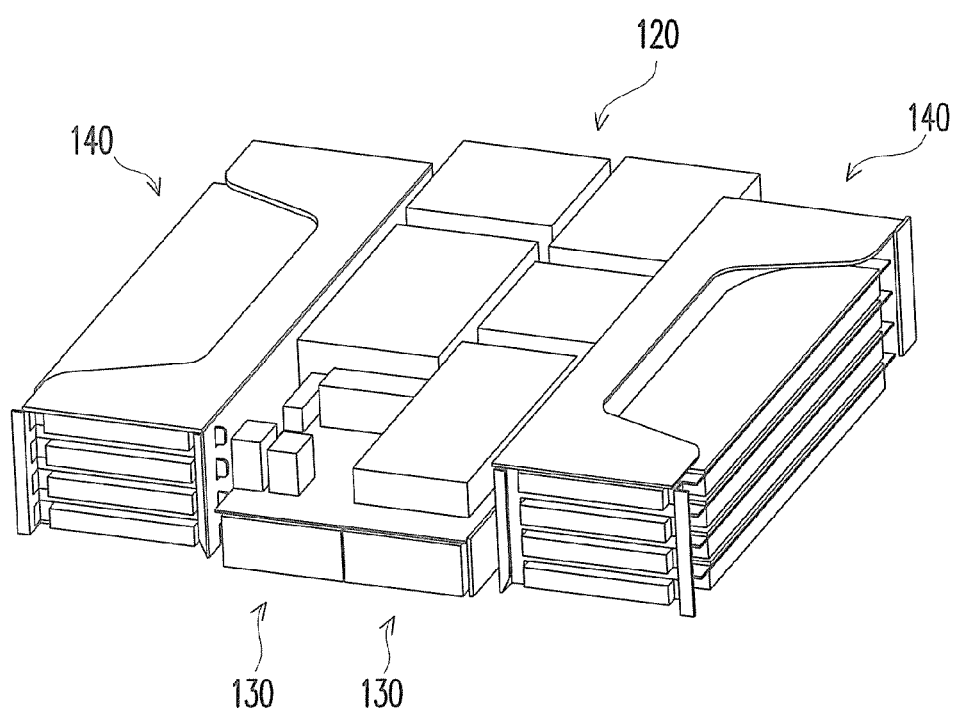
FIG. 2 is a schematic diagram showing architecture of partial components inside the server in FIG. 1.
Figure 3:
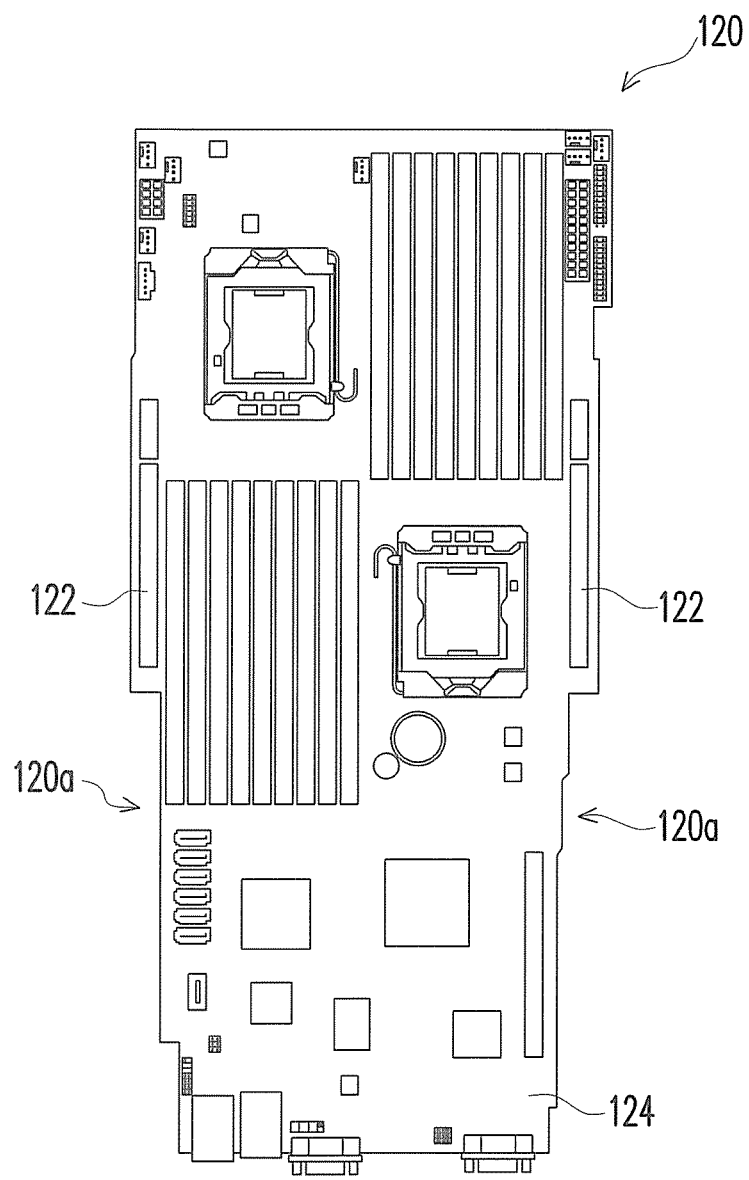
FIG. 3 is a top view showing a motherboard of the server in FIG. 1.

FIG. 1 is a schematic diagram showing a server in an embodiment, and FIG. 2 is a schematic diagram showing architecture of partial components inside the server in FIG. 1. FIG. 3 is a top view showing a motherboard of the server in FIG. 1. In the embodiment, a server 100 includes a casing 110 and a motherboard 120. The motherboard 120 is disposed in the casing 110. The casing 110 may meet the size standard of a 2U rack server. The motherboard 120 includes multiple components disposed at the motherboard, and the components may include active components (such as a central processing unit (CPU)), passive components (such as a capacitor and an inductor), electrical connectors (such as a universal serial bus (USB) connector and a network connector) and heat dissipating components. The configuration of the electrical components at the motherboard may be different according to the motherboard functions.

The server 100 further includes multiple power supply units 130 and two expansion modules 140 disposed in the casing 110. In order to use the space of the casing 110 more efficiently, the power supply units 130 are disposed under the motherboard 120, and the expansion modules 140 are disposed at two opposite sides of the motherboard 120 and electrically coupled to the motherboard 120. The motherboard 120 further includes two slots 122 for electrically coupling the expansion modules 140, and the slots 122 are also disposed at two opposite sides of the motherboard 120.

As shown in FIG. 2 and FIG. 3, in an embodiment, two concave portions 120a are formed at two opposite sides of the motherboard 120, respectively. When the expansion modules 140 are inserted vertically into the slots 122 of the motherboard, the expansion modules 140 are at the concave portions of the motherboard, and the edges of the expansion modules 140 contact with the concave portions 120a, respectively. Thus, the occupied space of the expansion modules 140 in the casing 110 and the occupied space of the motherboard 120 are stacked partially via the concave portions 120a, and the inner space of the casing 110 is utilized more efficiently.

Figure 4:
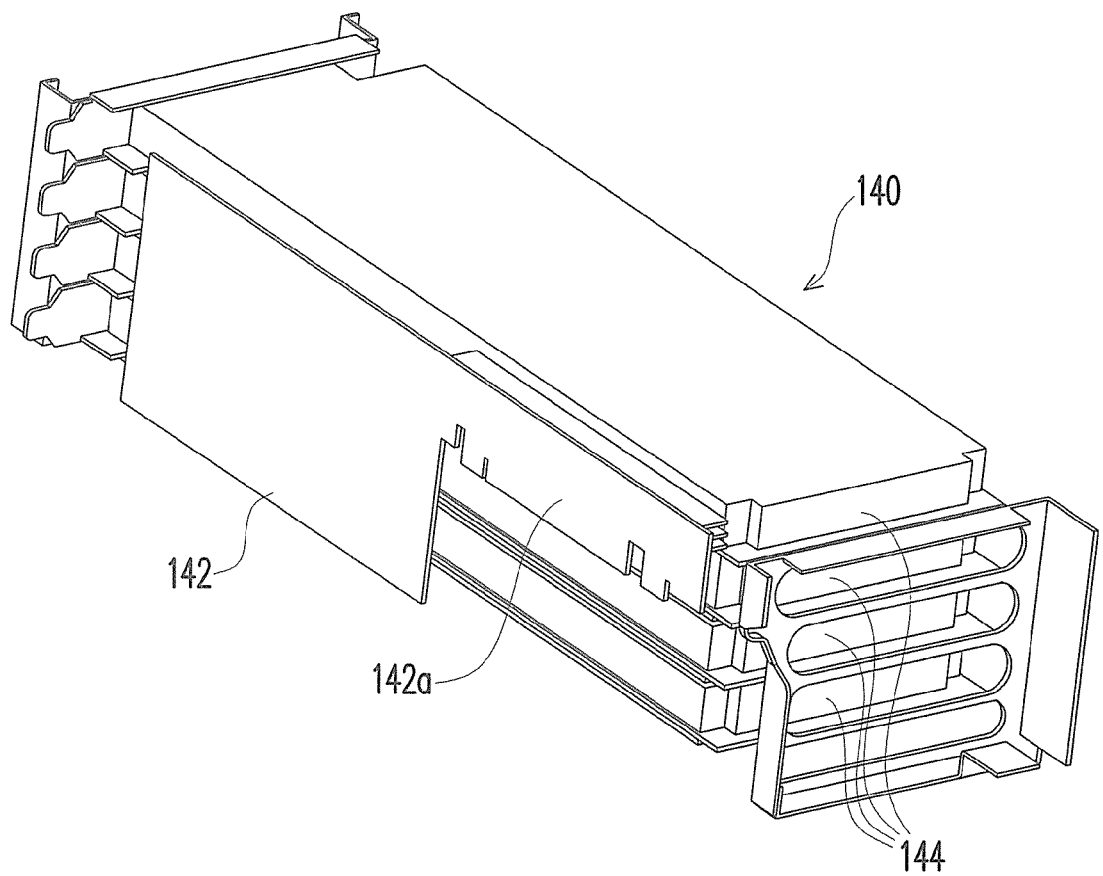
FIG. 4 is a schematic diagram showing an expansion module at a first side of the server in FIG. 1.
Figure 5:
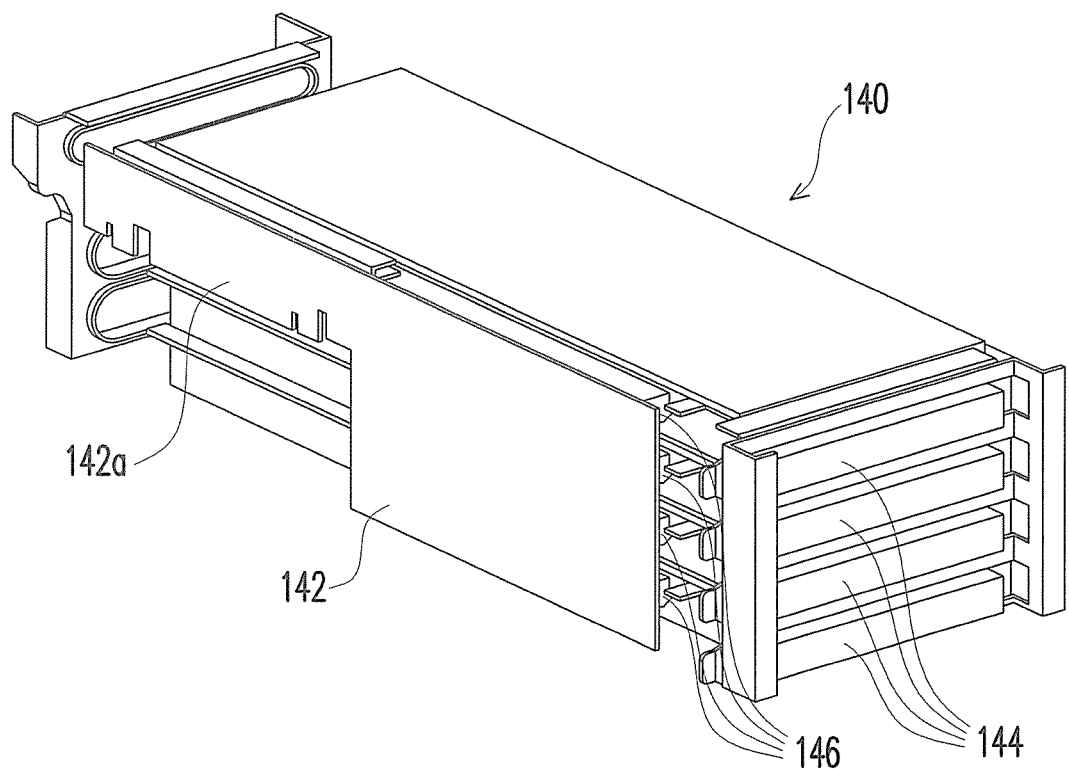
FIG. 5 is a schematic diagram showing an expansion module at a second side of the server in FIG. 1.

FIG. 4 is a schematic diagram showing an expansion module at a first side of the server in FIG. 1, and FIG. 5 is a schematic diagram showing an expansion module at a second side of the server in FIG. 1. Each of the expansion modules 140 includes a connecting card 142 electrically coupled to multiple expansion cards 144. The connecting card 142 includes an inserting portion 142a inserted to the slot 122 of the motherboard 120, so as to make the two connecting cards 142 at two opposite sides of the circuit board 124, respectively, and contact with the concave portions of the motherboard, respectively.

Each of the expansion modules 140 includes an expansion card slot 146 (as shown in FIG. 5) for electrically coupling the expansion cards 144 and the connecting card 142. The expansion card slots 146 are disposed at a side of the corresponding connecting card 142, respectively. The expansion cards 144 are inserted to the corresponding expansion card slots 146, and the expansion cards 144 are vertically connected to the connecting card 142 and parallel to the circuit board 124. In the embodiment, the expansion card slots 146 may have the same interface standard, such as peripheral component interconnect express (PCI-E), which is omitted herein.

Figure 6:
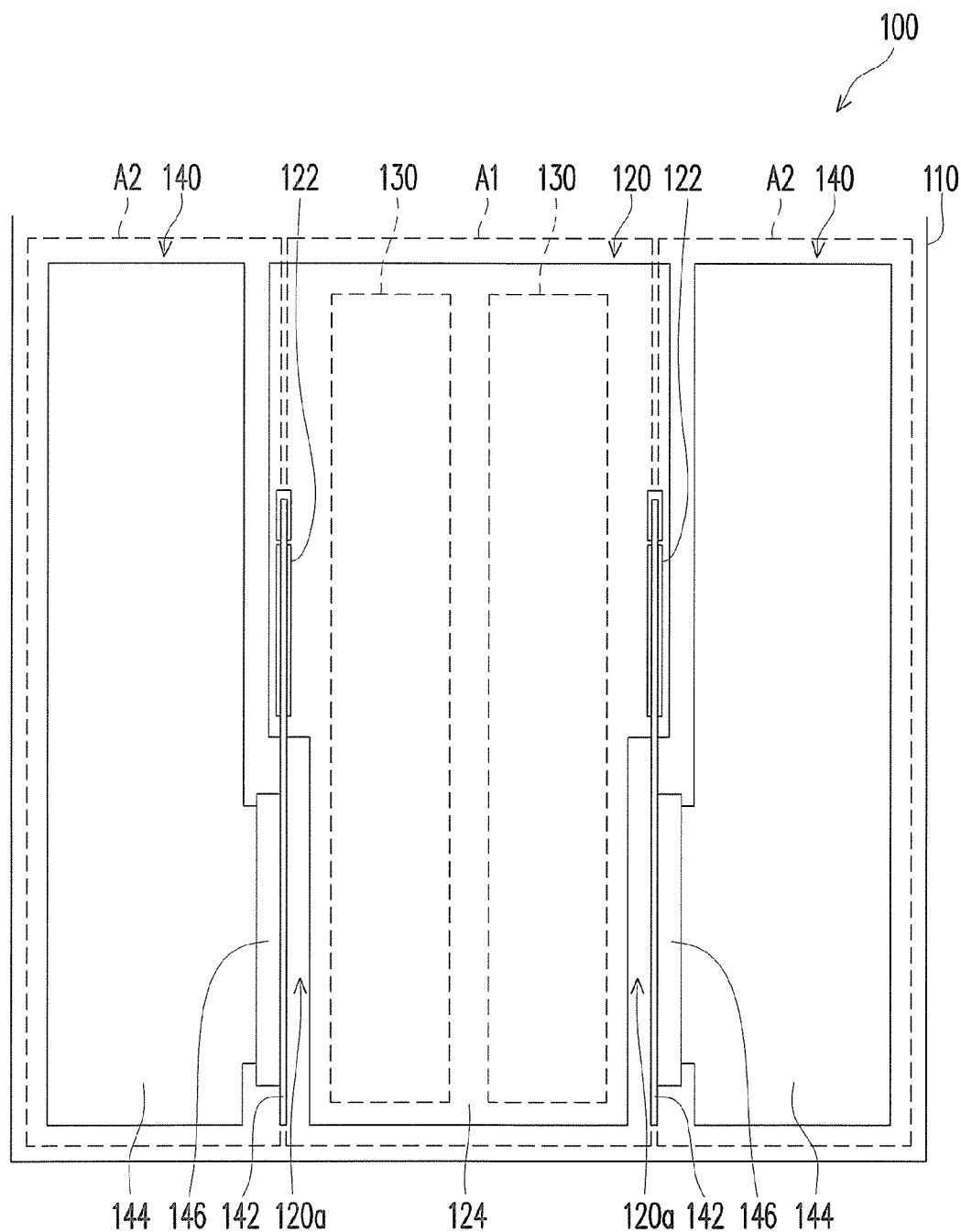
FIG. 6 is a schematic diagram showing a configuration of the server in FIG. 1.

FIG. 6 is a schematic diagram showing a configuration of the server in FIG. 1. As shown in FIG. 1 and FIG. 6, the two connecting cards 142 at the casing 110 may divide the space in the casing 110 into a middle space A1 and two lateral spaces A2 at two opposite side of the middle space A1. Volume of the two lateral spaces A2 may be different or the same. In the embodiment, Volume of the two lateral spaces A2 is the same. The motherboard 120 and the power supply unit 130 are disposed stackedly in the middle space A1, and the expansion modules 140 are respectively disposed at the two lateral spaces A2. The slots 122 are disposed at border between the middle space A1 and the lateral spaces A2.

In sum, the motherboard and the power supply unit are stacked and disposed in the casing in a limited space, and the two expansion modules are disposed at two opposite sides of the motherboard, respectively. The casing effectively accommodates two expansion modules via the concave portions at the motherboard, so as to improve the space utilization efficiency. The structure of the motherboard and the expansion modules is more stable, and the space utilization of the casing is also more efficient.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:

1. A server, comprising:
    a casing;
    a motherboard including two slots disposed in the casing;
    a power supply unit disposed under the motherboard in the casing; and
    two expansion modules disposed in the casing, wherein each of the expansion modules includes a plurality of expansion cards and a connecting card electrically coupled to one of the two slots of the motherboard, wherein the motherboard and the power supply unit are disposed stackedly in a middle space and are both entirely disposed between the expansion modules, and the expansion modules are physically adjacent to two opposite sides of the motherboard and the power supply unit correspondingly.

2. The server according to claim 1, wherein the motherboard further includes two concave portions formed at two opposite sides of the motherboard correspondingly, and the concave portions are adjacent to the slots, respectively.

3. The server according to claim 1, wherein the connecting cards are connected with the corresponding expansion cards and are vertically inserted to the slots of the motherboard, respectively.

4. The server according to claim 1, wherein the connecting card of each of the expansion modules includes an inserting portion for electrically coupled to one of the slots of the motherboard.

5. The server according to claim 1, wherein the connecting card of each of the expansion modules includes a plurality of expansion card slots for inserting the expansion cards.

6. The server according to claim 1, wherein the expansion cards are parallel to the motherboard.

7. The server according to claim 1, wherein the expansion card slots have same interface standard.

8. The server according to claim 1, wherein the interface standard of the expansion card slots is peripheral component interconnect express (PCI-E).

* * * * *